United States Patent [19]

Herrell

[11] 3,848,259

[45] Nov. 12, 1974

[54] MULTICONTROL LOGIC GATE DESIGN

[75] Inventor: Dennis J. Herrell, Somers, N.Y.

[73] Assignee: International Business Machines Corporation, Armonk, N.Y.

[22] Filed: Oct. 30, 1973

[21] Appl. No.: 411,123

[52] U.S. Cl. .............................. 357/5, 357/6, 357/4, 307/306, 307/277, 307/212, 331/107 S

[51] Int. Cl. ........................... H01l 11/00, H01l 3/00

[58] Field of Search ...... 317/234 S, 234 T; 307/306, 307/277, 212; 331/107 S

[56] References Cited

UNITED STATES PATENTS

| | | | |
|---|---|---|---|
| 3,521,133 | 7/1970 | Beam | 317/234 |
| 3,522,492 | 8/1970 | Pierce | 317/235 |
| 3,764,863 | 10/1973 | Zappe | 317/234 R |
| 3,803,459 | 4/1974 | Matisov | 317/234 T |

*Primary Examiner*—Martin H. Edlow
*Attorney, Agent, or Firm*—Sughrue, Rothwell, Mion, Zinn & Macpeak

[57] ABSTRACT

A Josephson tunnelling device with means for producing magnetic fields which intercept the device. These fields establish screening currents in the device. The field producing means includes means for establishing a substantially 1:1 distribution of gate current through the device and the screening current. A particular embodiment is a Josephson logic gate having multiple control lines shaped to insure that current in each control line has the same effect on the junction as current in every other control line. Superconducting layers forming a Josephson tunnel device are sufficiently long to allow the gate currents and screening currents to spread evenly across the width of the Josephson junction.

19 Claims, 20 Drawing Figures

MULTICONTROL LOGIC GATE DESIGN

BACKGROUND OF THE INVENTION

The invention is in the field of Josephson devices and in particular pertains to the shaping of a Josephson device to insure identity of distribution versus width of the device for the gate current applied to the device and for screening currents caused by magnetic fields.

A comprehensive discussion of the physics and application of the Josephson effect is given in "Josephson-Type Superconductive Tunnel Junctions and Applications, " by Juri Matisoo, *IEEE Transactions on Magnetics*, Vol. Mag-5, No. 4, December, 1969, pp. 848–873 [Ref. 1]. The latter reference is incorporated herein for the purpose of providing background information on Josephson devices. Josephson devices, particularly Josephson oxide tunnel junctions, have been proposed and experimentally tested as switching and logic circuits. The switching and logic applications result primarily from the magnetic field dependence of the maximum Josephson supercurrent, $I_{max_1}$, that a Josephson device can carry. When the gate current through a device is $I_g$ and the applied magnetic field $H = H_1$ is such that $I_g < I_{max_1}$ the junction will be superconducting and no d.c. voltage will appear across the junction due to the applied current $I_g$. By changing the magnetic field H to a value $H_2$, $I_{max}$ will be reduced so that $I_{max} \leq I_g$, and the junction will switch to the nonsuperconducting state causing a voltage, usually designated $v = 2\Delta$, to appear across the junction. An output circuit connected in parallel with the Josephson device will carry no current when the device is in the $v = 0$ state and will carry a finite current when the device is in the $v = 2\Delta$state.

A curve of $I_{max}$ versus H is referred to as the gain curve. Two such gain curves are shown in FIGS. 13 and 18 of Ref. 1. Both curves are for non-linear Josephson junctions. A non-linear junction is one in which $\tau_j << L$, where $\tau_j$ is the Josephson penetration depth, and L is the length of the junction measured in the direction of current flow through the junction. As is well known, both parameters can be controlled.

The curves of FIGS. 13 and 14 are partially reproduced in FIGS. 1 and 2 herein. In both figures, the line $I_g$ and points $H_1$, $H_2$, 10 and 12 have been added to illustrate the switching function mentioned above. For a gate current $I_g$ and magnetic field $H_1$, the gate current will be less than $I_{max}$, as shown at point 10, and the junction will be in the $v = 0$ state. If the magnetic field is increased to $H_2$, the gate current will exceed the critical current $I_{max}$, as shown at point 12, and the device will switch to the $v = 2\Delta$ state.

It is also known that one technique for controlling the application of a magnetic field to a Josephson device includes placing a superconducting control line on an insulator overlaying the Josephson device and varying the current $I_c$ through the control line to concomitantly vary the applied magnetic field. For switching and logic functions the current $I_c$ is typically varied between two set values, e.g., O and $I_{c_1}$.

For logic functions, e.g., AND and OR functions, it has been proposed to use multiple control lines, one for each logic input, and to apply currents having values corresponding to O and $I_{c_1}$ to represent FALSE and TRUE logic inputs to each control line.

Devices having an asymmetric gain curve such as shown in FIG. 2 have been shown to be particularly useful as logic devices. Reference is made to the U.S. patent application Ser. No. 411,114, by D. Herrell, entitled "Universal Logic Block Using Josephson Tunnelling Junction," assigned to the assignee herein, and filed on the same date herewith, for a description of the multiple logic functions which can be accomplished by a single Josephson circuit element having an asymmetric gain curve.

A problem encountered in fabricating and using Josephson logic circuits is that the use of multiple control lines has been found to distort the gain curve. Additionally, it has been noted that a control current applied to one control line will not have the same effect on the logic gate as the same magnitude control current has when applied to another control line, even though both control lines overlay the same Josephson junction.

Accordingly, it is an object of the present invention to provide a Josephson tunnelling device having multiple means for applying magnetic fields to the device and having a smoother gain curve.

A further object is to provide a Josephson tunnelling device having multiple input control terminals and being responsive substantially identically to a given input irrespective of the input terminal to which said given input is applied.

Another object is to provide a Josephson tunnelling device circuit configuration in which the screening current flowing through the device bears a 1:1 distribution ratio to the gating current flowing through the device.

Another object is to provide an improved Josephson logic gate having multiple input control lines.

SUMMARY OF THE INVENTION

In accordance with the present invention a Josephson circuit is provided comprising a Josephson tunnelling device and means associated therewith for producing magnetic fields which intercept the device. The fields produce screening currents in the device, and the field producing means are such that the screening currents resulting therefrom and passing through said device have a distribution through said device which has a substantially 1:1 ratio to the distribution of gating current through said device.

The problem of creating a Josephson logic gate with multiple control lines, each having the same effect on the logic gate, has been solved by the present invention. The current through the Josephson tunnelling device includes the applied gate current and the screening currents which result from the diamagnetism of the superconductors. It has been discovered that the above problem can be solved by causing the distribution of the screening currents along the width of the device to be the same as the distribution of the gate current along the width of the device. Furthermore, as will be explained in greater detail hereafter, the desired one-to-one distribution of the gate and screening currents can be achieved by altering the geometry of the device, particularly the geometry of the two superconductors which form the electrodes of the Josephson tunnelling device.

DETAILED DESCRIPTION OF THE PREFERRED EMBODIMENT

Prior to presenting a description of the manner in which the invention is carried out, an example of the effect, which the geometries of the control current path and the gate current path have on the gain curve, will be given. Also, an explanation of screening currents and the effect such currents have on the gain curve will be given. The preferred embodiment of the invention will be described by way of an example in the environment of a Josephson logic circuit having multiple control lines and an asymmetric gain curve. It should nevertheless be appreciated that the invention, in its broadest aspects, is not limited to devices with asymmetric gain curves and is not limited to in-line configurations as will be described in the example.

Figure 1:
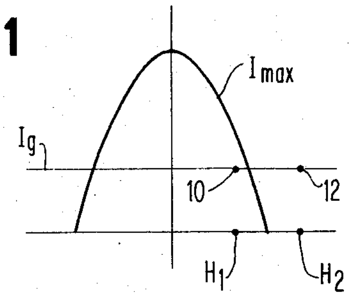
FIG. 1 is an illustration of a symmetrical gain curve for a Josephson junction.
Figure 2:
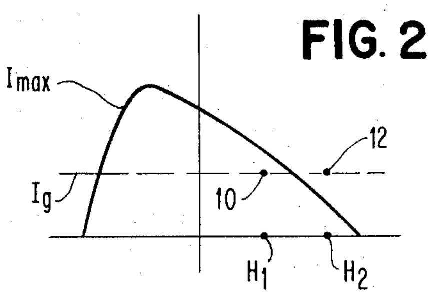
FIG. 2 is an illustration of an asymmetrical gain curve for a Josephson junction.

FIGS. 1 and 2 have already been discussed. A more detailed analysis of the theory of these curves can be found in Ref. 1. As pointed out there, the asymmetric curve results when a ground plane is used. This will be explained further hereafter.

Figure 3:
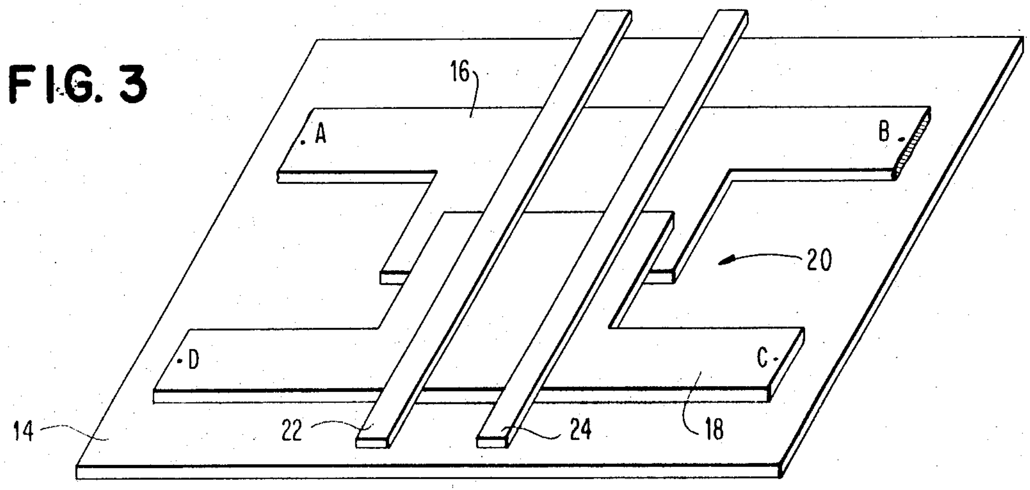
FIG. 3 is a perspective view of a Josephson junction test circuit used for studying the effect of current path variations on the gain curve.
Figure 4A:
FIGS. 4A – 4D represent gain curves obtained from the test circuit of FIG. 3.
Figure 4B:
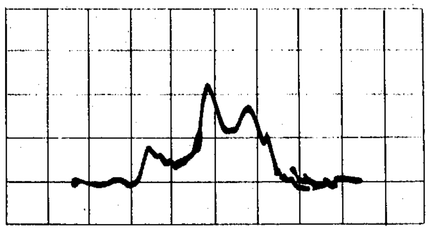
Figure 4C:
Figure 4D:
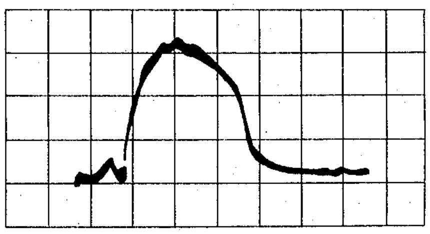

FIG. 3 illustrates a test circuit constructed by applicant. The gain curves plotted as a result of altering the paths of the control current $I_c$ and the gate current $I_g$ are illustrated in FIGS. 4A–4C. The circuit of FIG. 3 comprises a superconducting ground plane 14, designated the M1 layer because it is the first or bottom layer of the fabricated circuit, an M2 superconducting layer 16 separated from M1 by an insulator (not shown), an M3 superconducting layer 18, also separated from M1 by an insulator (not shown), and two M4 superconducting layers 22 and 24 overlying the junction region 20 and separated from M1, M2 and M3 by an insulator (not shown).

The Josephson tunnelling device 20 comprises the overlapped portions of layers 18 and 16, constituting the electrodes of the device and a tunnelling barrier, typically an oxide, of approximately 10–50A. depth therebetween as is well known in the art. The gain curves shown in FIGS. 4A–4B were obtained from FIG. 3. The differences among the four gain curves arise from application of the gate current or control current to different paths.

The gain curve of FIG. 4A was obtained by applying the gate current $I_g$ between terminal A of layer 16 and terminal D of layer 18 and by applying control current $I_c$ only to layer 24. FIG. 4B was obtained by applying $I_g$ between points A and D and by applying $I_c$ only to layer 22. FIG. 4C was obtained by applying $I_g$ between points B and C and $I_c$ only to layer 24. FIG. 4C was obtained by applying $I_g$ between points B and C and $I_c$ only to layer 22.

Figure 5:
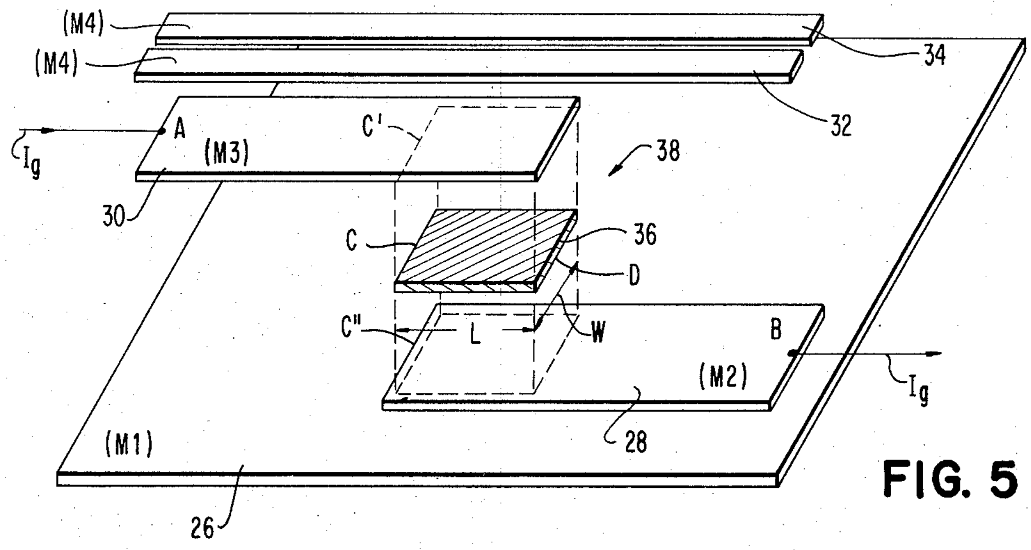
FIG. 5 is an exploded perspective view of a Josephson gate circuit. This view is helpful for explaining the flow of gate and screening currents in a Josephson junction.

An understanding of the qualitative effect of superconductor geometry on the gain curve can be appreciated by considering the case of the gate circuit shown in FIG. 5. The gate circuit illustrated by way of example is an in-line non-linear Josephson tunnelling device. The gate comprises superconducting layers 26, 28, 30, 32 and 34. Although the gate is shown in an exploded view for ease of following the subsequent description, it will be appreciated that the superconducting layers are separated from one another only by insulating layers (not shown). The exception is that M3 layer 30 and M2 layer 36 are separated in the junction region 38 only by the −50A. thick tunnelling barrier 36. The gate current is applied between M3 and M2 and flows through the device. When the current density through the device equals or exceeds the Josephson current density, $j_1$, the device switches from $v = 0$ to $v = 2\Delta$.

Figure 6:
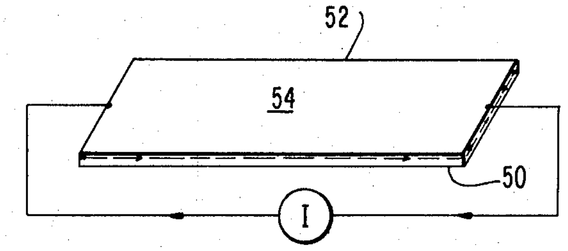
FIG. 6 is a perspective view of a superconductor and is included for the purpose of explaining the flow of current in a superconductor in the absence of a ground plane.

The current density is affected not only by the applied gate current but also by the magnetic field intercepting the tunnel junction. Referring to FIG. 6, a current, I, flowing through a superconductor 54 may be considered as analogous to electrons in a conductive plate. Electrons in a conductive plate repel one another resulting in an alignment of electrons on opposite edges of the plate. The lines of current in the superconductor tend to act the same way. As illustrated in FIG. 6 the current flow in superconductor 54 will be confined to edges 50 and 52 as shown by the dashed lines.

Figures 7A, 7B:
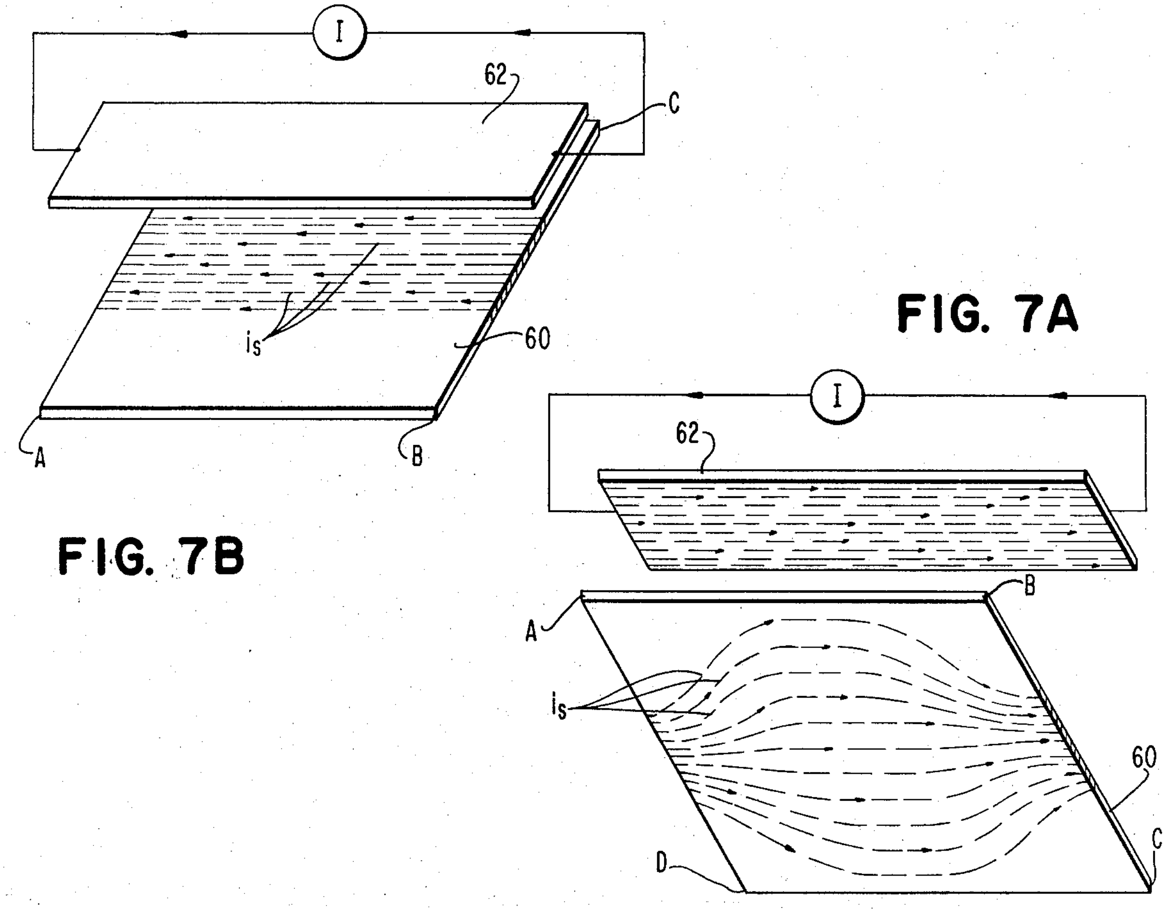
FIGS. 7A and 7B are perspective views taken from angles below and above a pair of superconductors. These figures illustrate the effect of the ground plane upon current flow and the phenomenon of the screening current.

However, when a second superconductor is positioned near the current carrying first superconductor, the current in said first superconductor distributes substantially evenly over the skin of the first superconductor on the bottom surface. This is illustrated in FIGS. 7A and 7B which represent two views of the same elements. FIG. 7A is a perspective view taken from below superconductors 60 and 62, whereas FIG. 7B is a perspective view taken from above the same two superconductors. The edges of superconductor 60 are labelled A, B, C and D in both FIGS. to illustrate the correspondence between the two views.

If current, I, is applied to the superconductor 62 as illustrated, the presence of superconductor 60 will cause the applied current, I, to distribute evenly in the skin of superconductor 62 along the bottom surface as seen by the dashed current lines along the bottom of 62 in FIG. 7A. Additionally, the applied current carried by superconductor 62, or more accurately, the magnetic field resulting from the applied current, causes a screening current, $i_s$, to flow in the skin of superconductor 60. This phenomenon is due to the diamagnetic property of a superconductor in response to small fields. The superconductor sets-up a circulating screening current to effectively screen-off the magnetic field and maintain the internal magnetic field at zero.

The screening current is restricted in the top surface of superconductor 60 to an area substantially the same as that of the bottom surface of superconductor 62 and flows in a direction opposite to the applied current in superconductor 62. It flows over the edge, along the bottom surface and back up the other edge, completing a closed loop. On the bottom of 60 the current distributes evenly over the surface.

Referring back to FIG. 5 it will now be explained how the ground plane and the resulting screening currents result in the device having an asymmetric gain curve such as is shown in FIG. 2. It should be noted that the assumption is made that there is a single control superconductor 32 (i.e., 34 is not included) having a width equal to or greater than layer 28.

The gate current, $I_g$, flows between points A and B via the following path: evenly distributed along the bottom of M3 from A to C'; through the junction near edge C to edge C'' on the bottom surface of M2; evenly distributed along the bottom of M2 from C'' to B. It will be noted that the junction is non-linear, i.e., $\tau_j << L$, and therefore the supercurrent entering the junction at C' flows mostly through the junction confined to the edge C. Also, it is assumed that nothing in the geometry of M3 and M2 prevents the current $I_g$ from being distributed uniformly along the width W as it passes through the junction.

Figure 8:
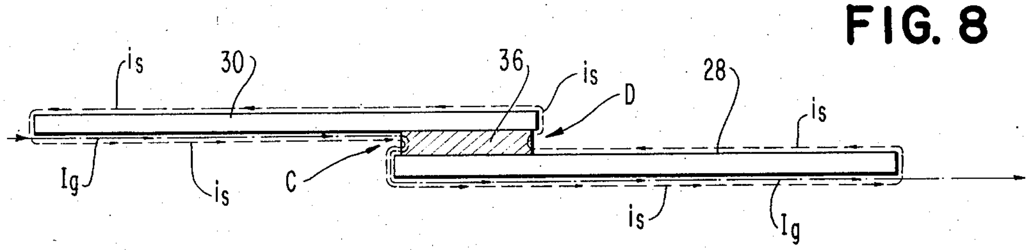
FIG. 8 is a cross-sectional side view of a portion of FIG. 5 and illustrates the additive and subtractive effect the screening current has on the gate current through the junction.

A picture of the flow of current $I_g$ is shown in FIG. 8, which is a cross-sectional side view of layers 30, 28 and 36 only. With no current applied to the control line 32, the external magnetic field is zero and the gate current needed to switch the junction out of its $v = 0$ state is $I_{g_0}$.

Now, assume a positive control current, $+I_c$, is applied to the single control line 32. (A control current in the same direction as $I_g$ is considered a positive control current.) The control current causes a screening current to flow in M3 and M2 as explained previously. Furthermore, since layer 32 is assumed at least as wide as the wider of M2 and M3, the screening current will distribute evenly along the width of M2 and M3 as it flows on the upper and lower surfaces. The flow of the screening current, $i_s$, due to a positive $I_c$, is also illustrated in FIG. 8. It can be seen that the screening current and gate current flow in the same direction through the junction along edge C. Consequently, the Josephson current density, $j_1$, will be reached at a lower $I_g$ than is the case where $I_c = 0$, i.e., no screening current aiding $I_g$. Thus, for a control current of $+I_c$ the gate current needed to switch the junction is $I_{g+}$, where $I_{g+} < I_{g_0}$.

When a control current of $-I_c$ is applied, the screening current will oppose the gate current going through the junction at edge C. Consequently, a larger $I_g$ will be needed to reach the Josephson current density. The $I_g$ needed to switch the junction will be $I_{g-}$, where $I_{g-} < I_{g_0}$. Within limits, an increase in a positive $I_c$ decreases $I_{max}$, and an increase in a negative $I_c$ increases $I_{max}$. The result is the relatively smooth gain curve of FIG. 2 which is asymmetric about $H = 0$, $I_c = 0$. (It will be noted that either H or $I_c$ may be plotted along the abscissa to obtain the gain curve.)

Contrary to the above explanation, the gain curve will not increase and decrease smoothly if the gate current is distributed along the width W differently than the screening current distributes along the width. In the above example both currents are distributed evenly along the width as they pass through the junction. This sameness in distribution versus width is referred to as a one-to-one distribution ratio of gate current to screening current. If there were no ground plane and the gate current distributed half on one edge and half on the other edge, such as described in connection with FIG. 6, the screening current would have to distribute in the same manner for there to be a one-to-one distribution ratio between screening and gate currents.

Referring back to FIG. 5, it can now be appreciated that the transition from a single control line Josephson gate having an asymmetric gain curve to a multiple control line Josephson gate having an asymmetric gain curve is not a simple matter of adding additional control lines. Each of the two control lines 32 and 34 is narrower than the superconductors 30 and 28. Consequently, the screening currents on the upper surface of superconductors 28 and 30 will be confined to a width narrower than W. This results in a distortion of the gain curve.

A logic gate with multiple control lines, in which current in any control line has the same effect on the gate as a like current in any other control line, can be provided by altering the gate geometry to insure a one-to-one distribution ratio versus width for the gate and screening currents.

In a preferred embodiment of the invention, both the screening current and the gate current are distributed evenly across the width of the junction. However, it should be noted that the invention is not limited to uniform distribution versus width.

There are two basic features of a Josephson tunnelling device circuit which can adversely affect the uniform distribution of the gate and screening currents. The first is the width-shape of the junction-forming superconductors in the vicinity of the junction. The second feature is the width of the screening current resulting from the externally applied magnetic fields.

Figure 9:
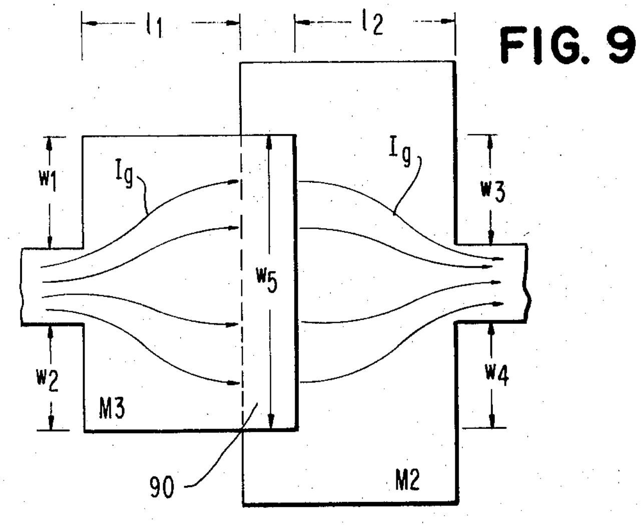
FIGS. 9 and 10 are top views of superconductor layers, and they illustrate one of the features of the present invention.
Figure 10:
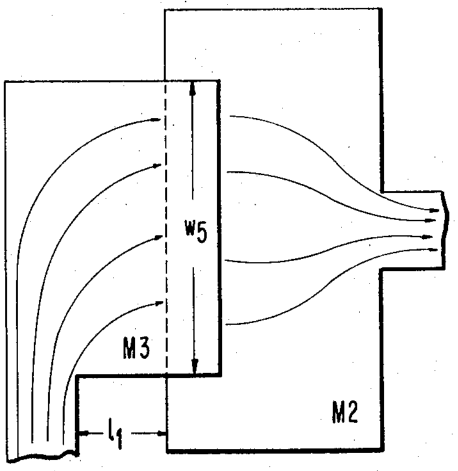

The effect which the width-shape has upon the distribution of currents can be seen in FIG. 9. The total width-shape of the M3 superconducting layer may be described as a relatively narrow portion leading to a wide portion. The wide portion has a width equal to the width, $W_j$, of the junction 90. The current $I_g$ spreads as indicated by the arrows in the figure. Whether or not the current is distributed uniformly across the width $W_j$ as it passes through the junction depends on the length, $l_1$, from the narrow passage to the junction and the distance, $W_1$ or $W_2$, whichever is larger. If $W_2$ is larger, it necessarily will be the controlling factor. It has been determined that adequate uniform distribution is obtained if the length of the wide portion (having width $W_j$ or greater) is at least equal to the distance in the width direction from the narrow portion to the farthest end of the junction. Thus, $M_3$ will be adequate to allow uniform distribution if $l_1 \geq W_2$ and $l_1 \geq W_1$. Superconductor $M_2$ will be sufficient to allow uniform distribution of current if $l_2 \geq W_3$ and $l_2 \geq W_4$. In FIG. 10, which illustrates a different shape for $M_3$, the latter layer will be adequate to allow uniform distribution of current if $l_1 \geq W_5$. It will be noted that in FIGS. 9 and 10, the existence of a ground plane is assumed.

The second feature, mentioned above as having an effect on the distribution of current, is the width of the screening current resulting from the externally applied magnetic fields. In the embodiment described herein the magnetic fields are applied by means of passing current through control lines in the vicinity of the junction forming superconductors. In this case the so called second feature affecting current distribution relates to the width of the control lines. The problem of non-uniform current distribution caused by relatively narrow control lines is solved by altering the geometry of the junction-forming superconductors, $M_2$ and $M_3$, to allow the screening currents, which result from the magnetic fields generated by current in the control lines, to be evenly distributed at the junction.

Figure 11A:
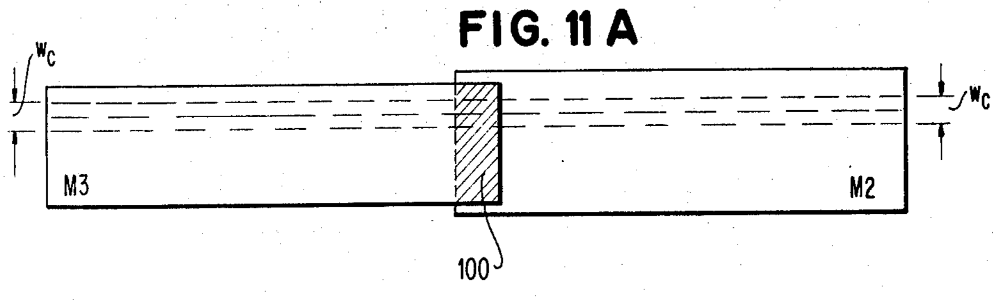
FIGS. 11A, 11B and 11C are top, side, and bottom views of a Josephson junction illustrating one of the features of the present invention.
Figure 11B:
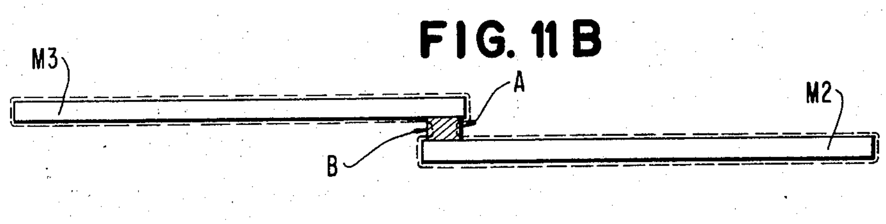
Figure 11C:
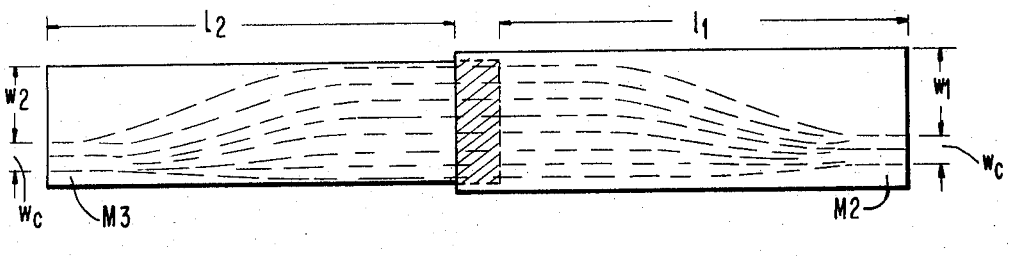

FIGS. 11A, 11B and 11C illustrate top, side and bottom views, respectively, if the $M_2$ and $M_3$ layers. The narrow width, $W_c$, of the screening current is caused by an externally applied magnetic field which is applied over the width $W_c$. It may be assumed that the magnetic field is generated by current flowing through a control line having a width substantially equal to $W_c$. In all the three figures the screening current is represented by the dashed lines. The screening current flowing in the top surface, FIG. 11A, is confined to a width substantially the same as the width $W_c$ of the control line. As the screening current flows over the edges of $M_2$ and $M_3$ and along the bottom, FIG. 11C, it is no longer confined, and it spreads out as shown.

The screening current passes through the junction at edges A and B as seen in FIG. 11B. From FIG. 11C it can be seen that the current through edge B will be uniformly distributed provided $l_1 \geq W_1$ and $l_2 \geq W_2$. Thus, as long as the screening current paths on both sides of the junction edge (B) are long enough and not facing the control line, the screen current will be evenly distributed.

Figure 12:
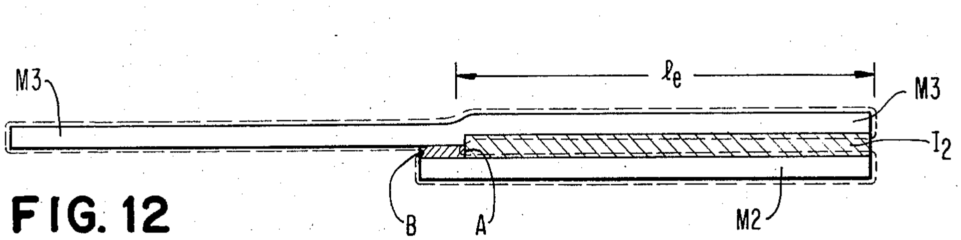
FIG. 12 is a cross-sectional side view of a Josephson junction and illustrates another feature of the present invention.

The screening current through the tunnelling barrier at edge A is constricted to width $W_c$. However, the superconducting path followed by the screening current may be constructed to cause the screening current path adjacent the junction to be unaffected by the constricting influence of the external magnetic field so that the screening current will spread evenly as it passes through edge A. This is accomplished by extending $M_3$ over an insulator, $I_2$, which extends over $M_2$. A side view of this configuration is shown in FIG. 12. The path of the screening current is represented by the dashed line. The junction edge A is now adjacent superconducting paths which are not subject to the screening current constricting influence of the magnetic field generated by the control line. The top of $M_2$ is shielded from the magnetic field by the extension of superconductor $M_3$. The bottom of the extension of superconductor $M_3$ is also not subject to the constricting influence of the magnetic field generated by the control line. Assuming that the extension of $M_3$ has a length, $l_e$, and a width equal to or greater than $W_j$, and that all other dimensions are as given in FIG. 11C, the screening current will distribute uniformly through edge A provided $l_e \geq W_j$.

The screening current will also distribute uniformly through edge B for the reasons given above in connection with FIG. 11. However, it should be noted that since the top surface of $M_2$ is no longer subject to the screening current constricting influence of the control line, $M_2$ need not have a length $l_1$ $W_1$. An additional advantage can be achieved by extending $M_2$ to the left and making the device geometry symmetrical. In that case the tunnelling barrier would not have to be formed on any edge, making it somewhat easier to fabricate a good tunnelling junction.

Figure 13:
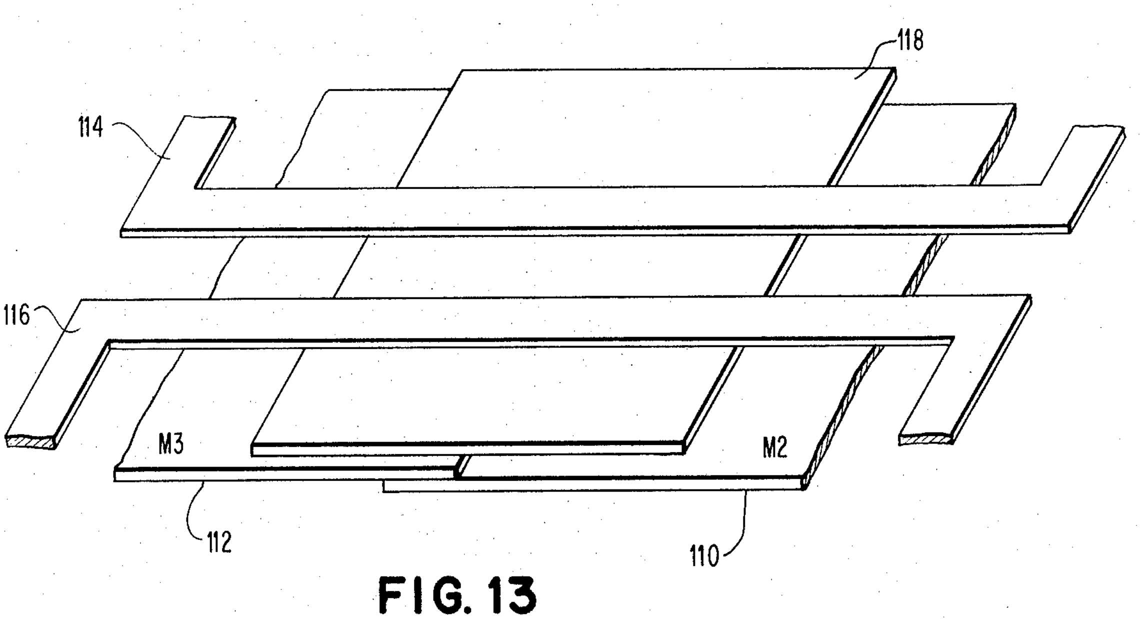
FIG. 13 is a perspective view of a Josephson gate with an added superconducting layer.

An alternative approach to that described in connection with FIG. 12 is to place an additional superconducting layer and an additional insulating layer between the junction-forming layers ($M_2$, $M_3$) and the means for generating the magnetic field, such as control line ($M_4$). This approach is illustrated in FIG. 13 wherein the $M_2$ layer 110 and $M_3$ layer 112 are separated from the control lines 114 and 116 by an additional superconducting layer 118. As is well known, insulating layers (not shown) are provided between all superconducting layers except at contact points and at the Josephson tunnelling device. In this case the currents through the narrow control lines 114 or 116 generate magnetic fields which cause screening currents to flow in layer 118. The latter screening currents will be constricted in the upper surface of 118 but will spread when flowing along the bottom surface of 118. The screening current in 118 results in screening currents in the $M_2$ and $M_3$ layers. However, the screening currents in $M_2$ and $M_3$ will not be constricted by the narrow width of the control lines 114 and 116.

Figure 14:
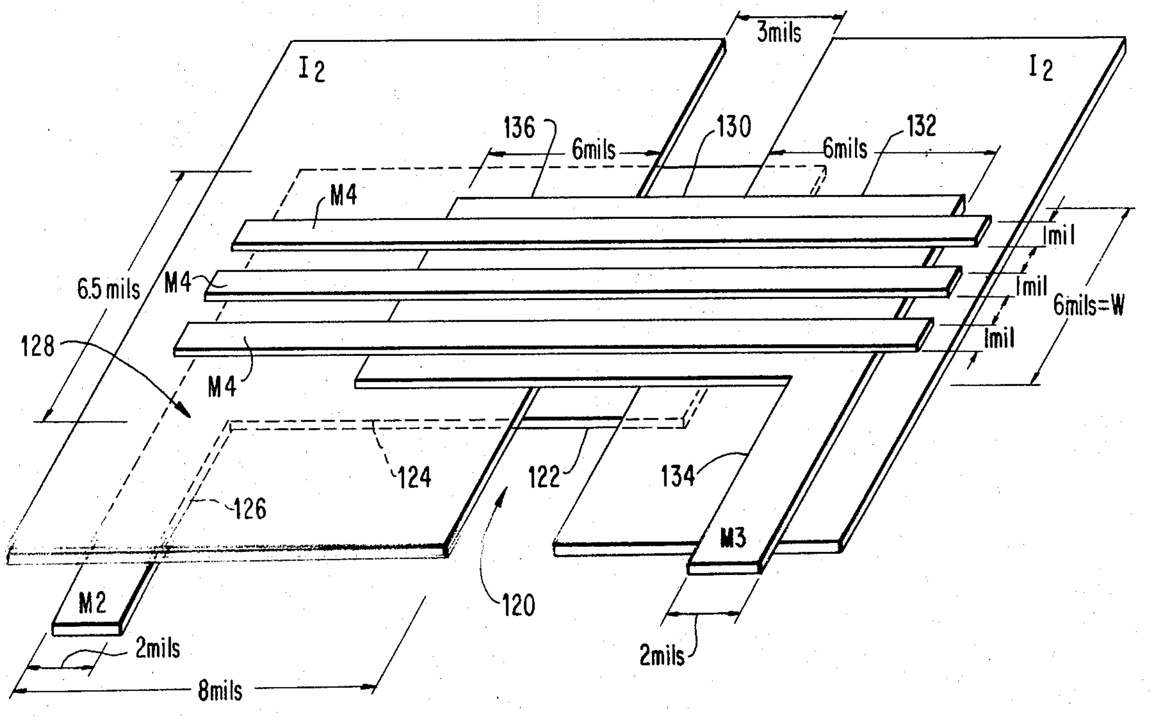
FIG. 14 is a top view of a Josephson gate incorporating the features of FIGS. 10, 11 and 12.

A specific example of a three input (three control lines) Josephson junction logic gate including the features mentioned above is illustrated in FIG. 14. The layers are labelled $M_2$, $M_3$, $M_4$ and $I_2$ in accordance with the designations previously explained. A ground plane, not shown, is underneath the illustrated structure. The dimensions are shown in mils. It can be seen that $M_3$ extends six mils past the edge of the junction. The insulating layer $I_2$ separates $M_2$ from $M_3$ except in the junction region. Additional insulating layers are provided as is well known in the art to insulate $M_4$ and $M_1$ (ground plane) from the other superconductor layers.

A device according to the above geometry constructed using known fabrication methods and having a parallel path with resistance $R = 0.4\Omega$ connected across the junction had the following parameters:

$\tau_j$ = Josephson penetration depth = 1 mil;
$L/\tau_j = 3$, (non-linear junction);
$j_1$ = Josephson current density = 250 amp/cm$^2$;
$I_{m_0}$ = maximum zero field Josephson current = 17.5 ma.

For a gate current of $I_g = 14.8$ ma., a control line current of 7.2 ma. caused the junction to switch to the $v \neq 0$ state, resulting in an output control current of $I_{out} = 7.2$ ma.

In accordance with the teachings of the present invention as described previously the $M_2$ and $M_3$ layers of FIG. 14 are shaped to allow a one-to-one distribution of the gate and screening currents through the junction. The $M_2$ layer comprises three parts (although the parts are integral they are referred to individually for the purpose of defining the shape of $M_2$). The first part, 122, forms one electrode of the tunnelling device 120. The second part, 124, adjoins the first part and is rectangular in shape. The third part, 126, is narrower than the second part in the direction transverse to current flow and adjoins the second part, 124, at a point distant from the junction. The rectangular part has a width (6.5 mils) at least as large as the width (6 mils) of the junction. Also, the length (8 mils) from said distant point, 128, to said junction is at least as great as the distance in the width direction from said distant point to the farthest edge of said rectangle (6.5 mils).

The $M_3$ layer comprises three parts, 130, 132 and 136 which are subject to the same constraints mentioned above. The $M_3$ layer further comprises a fourth part, 136, which adjoins the first part, 130, and extends away from the junction in an opposite direction from the second part, 132. The fourth part, 136, overlies and is insulated from the rectangular part of $M_2$.

What is claimed is:

1. A Josephson tunnelling device comprising first and second superconductors having a tunnel barrier therebetween which is sufficiently thin to allow Josephson tunnelling current therethrough, means for producing magnetic fields which intercept said Josephson tunnelling device and establish screening currents therein, and means for causing said screening current to distribute through said tunnel barrier in substantially the same pattern as said Josephson tunnelling current distributes through said tunnel barrier.

2. A Josephson tunnelling device as claimed in claim 1 wherein said distribution of screening current through said tunnel barrier is a substantially uniform distribution along the dimensions of said tunnel barrier transverse to the direction of said screening current.

3. A Josephson tunnelling device as claimed in claim 2 wherein said means for causing distribution comprises superconducting paths joined to said first and second superconductors, said superconduting paths being shaped to substantially evenly spread said screening current in the portions thereof adjacent said tunnelling barrier.

4. A circuit device comprising:

a. a Josephson tunnelling device comprising first and second superconducting electrodes and a tunnelling barrier therebetween, said tunnel barrier being sufficiently thin to support a Josephson tunnelling current, b. first and second superconducting paths joined to said first and second superconducting electrodes, respectively, for carrying current to said tnnnelling device, c. a plurality of means for creating magnetic fields which intercept said Josephson tunnelling device and establish screening currents in said first and second superconducting paths, said first and second electrodes, and said tunnel barrier, d. said first and second superconducting paths having respective shapes which results in a substantially one-to-one distribution ratio through said tunnel barrier of a current applied to said barrier via said first and second superconducting paths and said screening currents.

5. A circuit device as cliamed in claim 4 wherein said applied current is a gate current.

6. A circuit device as claimed in claim 5 wherein said first and second superconducting paths are shaped to spread said gate and screening currents uniformly across the dimension of said barrier that is transverse to the direction of gate and screening current flow.

7. A circuit device as claimed in claim 6 wherein a portion of each of said first and second superconducting paths adjacent said superconducting electrodes has the shape of a rectangle, said rectangle having a width at least as large as the width of said tunnel barrier and a length at least as long as the distance in the width direction between the point where a narrower part of said layer joins said rectangular portion and the farthest edge of said rectangular portion.

8. A Josephson tunnelling gate comprising a substrate, a superconducting ground plane on said substrate, a first insulator on said ground plane, a second superconducting layer on said first insulator, a tunnelling oxide on a portion of said second superconducting layer, a third superconductor layer, a part of which overlies said tunnelling oxide to form a tunnelling junction with said oxide and said second superconductor layer, a second insulator over said second and third superconducting layers, a plurality of superconducting control lines, each being thinner than the width of said second and third superconductor layers in the vicinity of said junction and each being positioned on said second insulator and extending directly over said junction, said third superconducting layer having at least first, second and third parts, said first part being on said oxide and forming a part of said junction, said second part being rectangular in shape and joined to said first part, said third part being narrower than said second part in a direction transverse to the direction of current flow through said third superconductor and being joined to said second part at a point distant from said first part, said rectangular shape having a width at least as great as the width of said junction and a length from said distant point to said junction at least as great as the distance in the width direction between said distant point and the farthest edge of said second part.

9. A Josephson tunnelling gate as claimed in claim 8 wherein said second superconducting layer comprises first, second and third parts, said first part forming a part of said tunnelling junction, said second part being rectangular in shape, joined to said junction, and extending away from said junction in a direction opposite to the direction of the second part of said third superconducting layer, said third part being narrower than said second part in a direction transverse to the direction of current flow through said second superconductor and being joined to said second part at a point distant from said first part, said rectangular shape having a width at least as great as the width of said junction and a length from said distant point to said junction at least as great as the distance in the width direction between said distant point and the farthest edge of second part.

10. A Josephson tunnelling gate as claimed in claim 9 wherein said third superconductor further comprises a fourth part joined to said first part on the opposite side of said junction from said second part, said third part overlying and insulated from the second part of said second semiconductor.

11. A Josephson circuit of the type having a Josephson tunnelling device formed by two superconducting layers and a tunnel barrier material therebetween, a plurality of superconducting control lines electrically insulated from said junction, wherein the improvement comprises an additional superconducting layer positioned between and insulated from said two superconducting layers on the one hand and said superconducting control lines on the other hand.

12. A Josephson circuit as claimed in claim 11 further comprising a substrate, a superconducting ground plane on said substrate, and wherein said two superconducting layers overlay and are insulated from said ground plane.

13. A Josephson circuit as claimed in claim 12 wherein said two superconductors are shaped to uniformly distribute a gate current applied thereto across the width of said tunnel barrier.

14. A Josephson circuit as claimed in claim 13 wherein each of said two superconducting layers has a rectangular shape in the vicinity of said tunnel barrier, said rectangular shape having a width at least as great as the width of said tunnel barrier and a length at least as great as the distance in the width direction from an adjacent part of said superconductor to the farthest edge of said rectangle.

15. A Josephson circuit as claimed in claim 13 wherein each of said two superconducting layers has a rectangular shape in the vicinity of said tunnel barrier, said rectangular shape having a width at least as great as the width of said tunnel barrier and a length at least as great as the width of said tunnel barrier.

16. A method of forming a Josephson gate having multiple control lines wherein each control line has the same effect on the gate switching properties, as does every other control line, said method being of the type which includes forming a tunnelling junction between portions of first and secnd superconductor layers, forming an insulating layer over said junction and forming said multiple control lines on said insulator to pass over said junction, wherein the improvement comprises:

a. shaping said first superconducting layer in the vicinity of said junction to carry a gate current and a screening current into said junction with a one-to-one distribution ratio, and b. shaping said second superconducting layer in the vicinity of said junction to carry a gate current and a screening current into said junction with a one-to-one distribution ratio.

17. The method as claimed in claim 16 wherein said junction and first and second layers are formed on an insulator layer overlaying a superconducting ground plane, and wherein the step of shaping said first superconducting layer comprises:

forming said first superconductor layer in a shape comprising a first, second and third part, said first part being part of said junction, said second part being rectangular in shape and adjoined to said first part, said third part being narrower than said second part in a direction transverse to the direction of current flow through said third superconductor and being joined to said second part at a point distant from said first part, said rectangular shape having a width at least as great as the width of said junction and a length from said distant point to said junction at least as great as the distance in the width of direction between said distant point and the farthest edge of said second part.

18. The method as claimed in claim 17 wherein the step of shaping said second superconductor layer comprises, forming said second superconductor layer in a shape comprising a first, second and third part, said first part forming a part of said tunnelling junction, said second part being rectangular in shape, joined to said junction, and extending away from said junction in a direction opposite to the direction of the second part of said third superconducting layer, said third part being narrower than said second part in a direction transverse to the direction of current flow through said second superconductor and being joined to said second part at a point distant from said first part, said rectangular shape having a width at least as great as the width of said junction and a length from said distant point to said junction at least as great as the distance in the width direction between said distant point and the farthest edge of said second part.

19. The method as claimed in claim 18 wherein the step of shaping said first superconducting layer further comprises, forming a fourth part of said first superconducting layer, said first part forming a part of said tunnelling junction, said second part being rectangular in shape, joined to said junction, and extending away from said junction in a direction opposite to the direction of the second part of said third superconducting layer, said third part being narrower than said second part in a direction transverse to the direction of current flow through said second superconductor and being joined to said second part at a point distant from said first part, said rectangular shape having a width at least as great as the width of said junction and a length from said distant point to said junction at least as great as the distance in the width direction between said distant point and the farthest edge of said second part.

* * * * *

UNITED STATES PATENT OFFICE

CERTIFICATE OF CORRECTION

Patent No. 3,848,259 Dated November 12, 1974

Inventor(s) Dennis J. Herrell

It is certified that error appears in the above-identified patent and that said Letters Patent are hereby corrected as shown below:

IN THE SPECIFICATIONS:

Column 4, line 9, "10-50A" should be --10-50Å --

Column 4, line 36, "-50A" Should be-- -50Å --

Column 8, line 6, Insert symbol -- ≥ -- after "$l_1$"

IN THE CLAIMS:

Claim 3, column 9, line 36, "superconduting" should be--superconduct- -- ing --.

Claim 4, column 9, line 48, "tnnnelling" should be--tunnelling--

Claim 9, column 10, line 53, insert--said--after "of"

Claim 16, Column 11, line 31, "secnd" should be--second--

Signed and sealed this 4th day of February 1975.

(SEAL)
Attest:

McCOY M. GIBSON JR.
Attesting Officer

C. MARSHALL DANN
Commissioner of Patents

FORM PO-1050 (10-69)

USCOMM-DC 60376-P69
U.S. GOVERNMENT PRINTING OFFICE : 869-930